(12) United States Patent
Chen et al.

(10) Patent No.: US 8,456,855 B2
(45) Date of Patent: Jun. 4, 2013

(54) PRINTED CIRCUIT BOARD

(75) Inventors: Yung-Chieh Chen, New Taipei (TW);
Duen-Yi Ho, New Taipei (TW);
Shou-Kuo Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 144 days.

(21) Appl. No.: 13/212,179

(22) Filed: Aug. 18, 2011

(65) Prior Publication Data

US 2013/0039025 A1    Feb. 14, 2013

(30) Foreign Application Priority Data

Aug. 10, 2011   (TW) .............................. 100128483 A

(51) Int. Cl.
*H05K 7/00*   (2006.01)
*H05K 1/18*   (2006.01)
*H05K 1/11*   (2006.01)

(52) U.S. Cl.
USPC ........... 361/782; 361/778; 361/792; 361/767; 361/763; 361/811; 174/260; 174/261; 174/262; 174/264

(58) Field of Classification Search
None
See application file for complete search history.

(56) References Cited

U.S. PATENT DOCUMENTS

| | | | | |
|---|---|---|---|---|
| 6,985,364 | B2 * | 1/2006 | Higashitani et al. | 361/763 |
| 8,164,006 | B2 * | 4/2012 | Kim et al. | 174/262 |
| 8,320,137 | B2 * | 11/2012 | Lee et al. | 361/782 |
| 2010/0254108 | A1 * | 10/2010 | Kim et al. | 361/782 |

\* cited by examiner

*Primary Examiner* — Jayprakash N Gandhi
*Assistant Examiner* — Dion Ferguson
(74) *Attorney, Agent, or Firm* — Altis Law Group, Inc.

(57) ABSTRACT

A printed circuit board includes a first to a fifth connector pads, a first to an eighth coupling capacitor pads, a first to a tenth transmission lines, a first via and a second via, a first to a fourth sharing pads, and a voltage converting circuit. The printed circuit board is operable to selectively support different types of connectors.

5 Claims, 6 Drawing Sheets

PRINTED CIRCUIT BOARD

CROSS-REFERENCE OF RELATED APPLICATION

Relevant subject matter is disclosed in a pending U.S. patent application with application Ser. No. 12/978,527, filed on Dec. 24, 2010, with the same title "PRINTED CIRCUIT BOARD", which is assigned to the same assignee as this patent application.

BACKGROUND

1. Technical Field

The present disclosure relates to printed circuit boards (PCBs) and, particularly, to a PCB selectively supporting different connectors.

2. Description of Related Art

A computer motherboard includes a plurality of connectors for mounting different cards, such as display cards, or sound cards. However, these connectors need to receive different working voltages. Thus, the connectors and the power circuits of the different connectors complicates the design and the layout of the motherboard. Therefore, there is room for improvement in the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
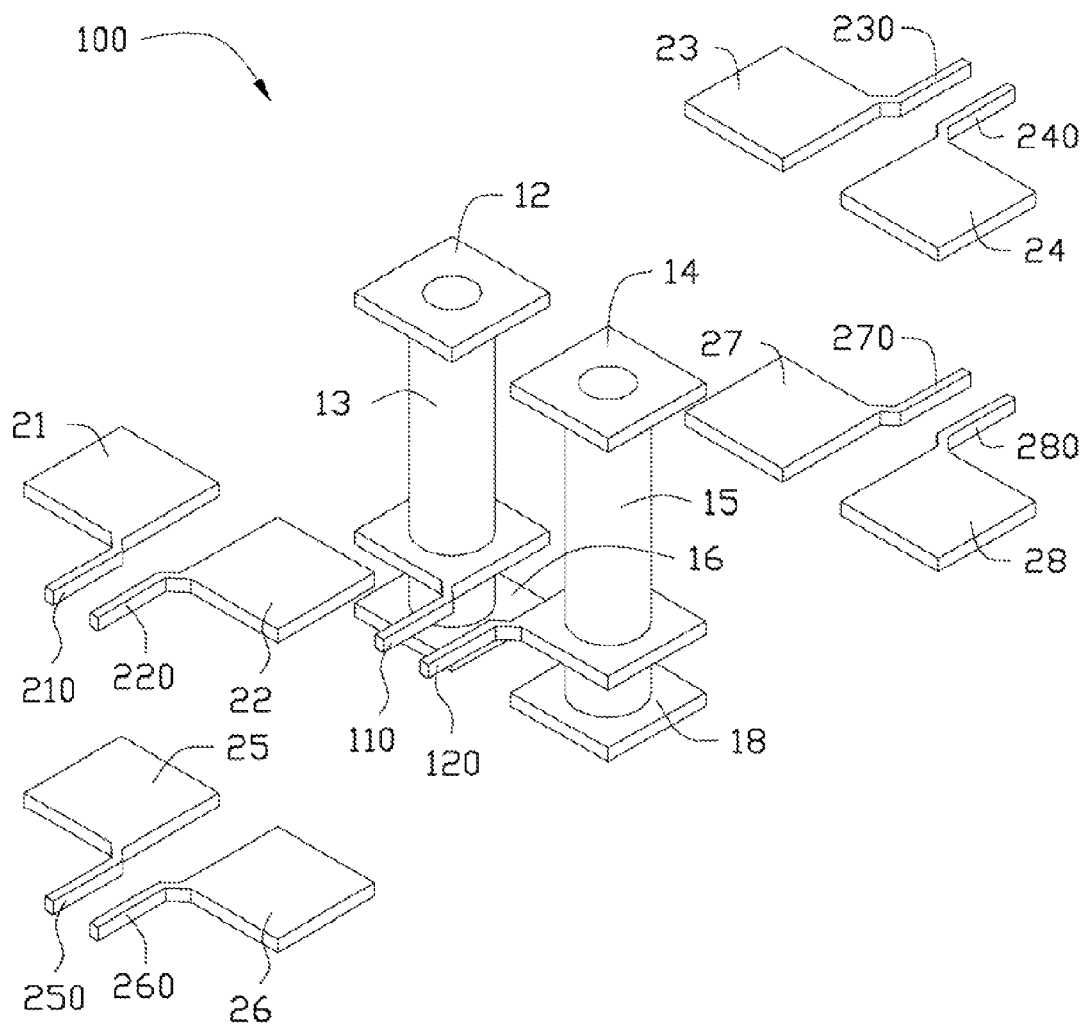
FIG. 1 is a schematic, isometric view of an embodiment of a printed circuit board (PCB).
Figure 2:
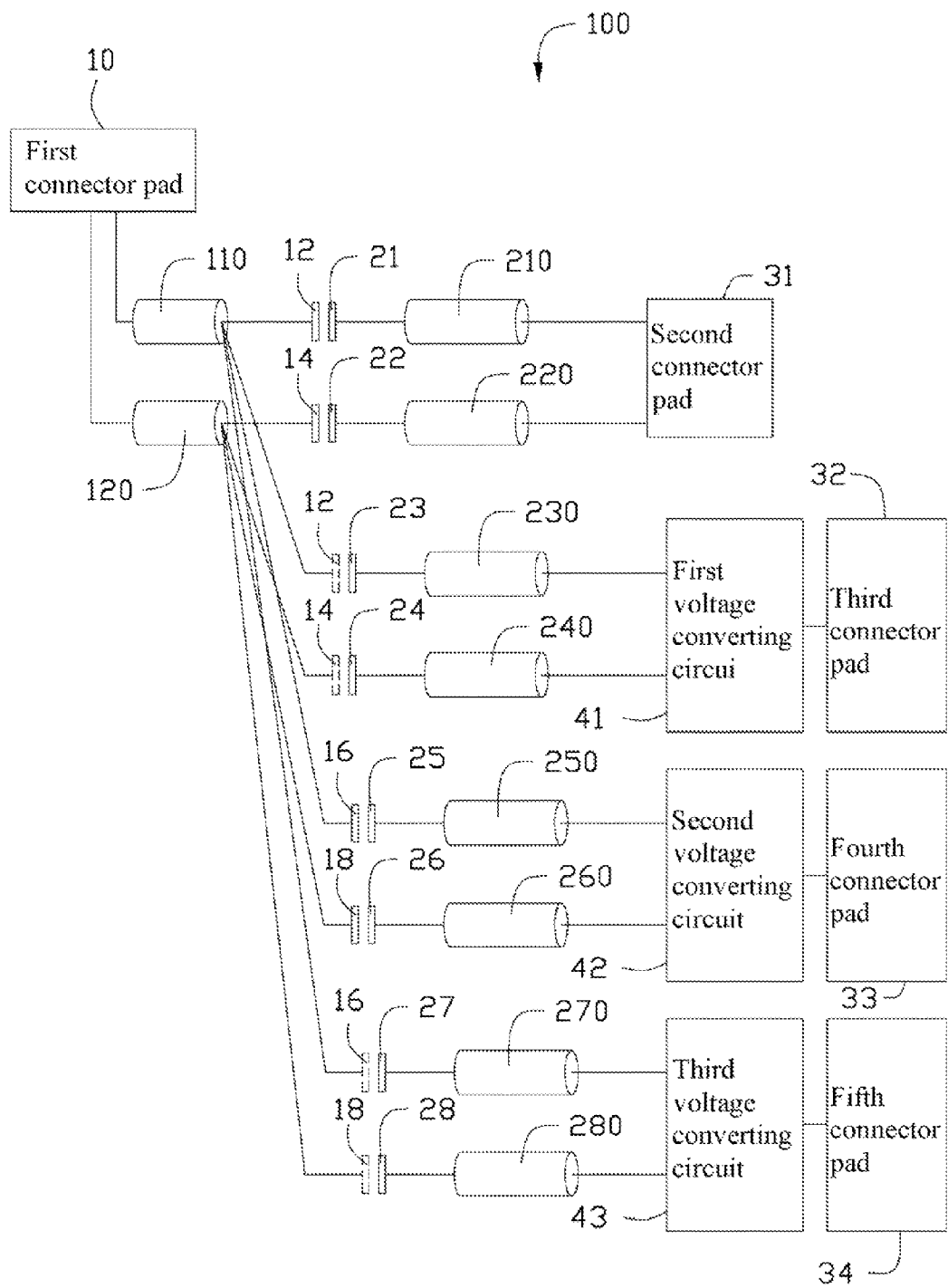
FIG. 2 is a circuit diagram of the PCB of FIG. 1, wherein the PCB includes a first connector pad for connecting a first connector.

Referring to FIGS. 1 and 2, an embodiment of a printed circuit board (PCB) 100 includes a first connector pad 10, first to eighth coupling capacitor pads 21-28, second to fifth connector pads 31-34, transmission lines 110, 120, 210, 220, 230, 240, 250, 260, 270, and 280, first to fourth sharing pads 12, 14, 16, and 18, and first to third voltage converting circuits 41-43. In one embodiment, the second and third connector pads 31 and 32, the transmission lines 210, 220, 230, and 240, the first to fourth coupling capacitor pads 21-24, the first and second sharing pads 12 and 14, and the first voltage converting circuit 41 are arranged in a first layer of the PCB 100. The fourth and fifth connector pads 33 and 34, the transmission lines 250, 260, 270, and 280, the fifth to eighth coupling capacitor pads 25-28, the third and fourth sharing pads 16 and 18, and the second and third converting circuits 42 and 43 are arranged in a second layer of the PCB 100 below the first layer. The transmission lines 110 and 120 are arranged in a third layer between the first layer and the second layer of the PCB 100. The first sharing pad 12 is electrically connected to the third sharing pad 16 through a first via 13. The second sharing pad 14 is electrically connected to the fourth sharing pad 18 through a second via 15.

In one embodiment, the first and second connector pads 10 and 31 are peripheral component interconnect express (PCIE) connector pads, to mount PCIE connectors. The third to fifth connector pads 32-34 are respectively a serial attached small computer system interface (SCSI) (SAS) connector pad, a serial advanced technology attachment (SATA) connector pad, and a universal serial bus (USB) connector pad, to respectively mount a SAS connector, a SATA connector, and a USB connector. A work voltage of the PCIE connector is 3.3 volts (V), and work voltages of the SAS connector, the SATA connector, and the USB connector are all 5V. In one embodiment, the first to third voltage converting circuits 41-43 are booster circuits. In other embodiments, the first to the third voltage converting circuits 41-43 may be buck circuits according to need.

The first connector pad 10 is arranged in the first layer or the second layer of the PCB 100. First terminals of the transmission lines 110 and 120 are connected to the first connector pad 10, and second terminals of the transmission lines 110 and 120 are respectively connected to the first via 13 and the second via 15. First terminals of the transmission lines 210 and 220 are connected to two input terminals of the second connector pad 31. Second terminals of the transmission lines 210 and 220 are respectively connected to the first and second coupling capacitor pads 21 and 22. First terminals of the transmission lines 230 and 240 are connected to two input terminals of the third connector pad 32 through the first voltage converting circuit 41. Second terminals of the transmission lines 230 and 240 are respectively connected to the third and fourth coupling capacitor pads 23 and 24. First terminals of the transmission lines 250 and 260 are connected to two input terminals of the fourth connector pad 33 through the second voltage converting circuit 42. Second terminals of the transmission lines 250 and 260 are respectively connected to the fifth and sixth coupling capacitor pads 25 and 26. First terminals of the transmission lines 270 and 280 are connected to two input terminals of the fifth connector pad 34 through the third voltage converting circuit 43. Second terminals of the transmission lines 270 and 280 are respectively connected to the seventh and eighth coupling capacitor pads 27 and 28.

The first sharing pad 12 is arranged between the first and third coupling capacitor pads 21 and 23. The second sharing pad 14 is arranged between the second and fourth coupling capacitor pads 22 and 24. The third sharing pad 16 is arranged between the fifth and seventh coupling capacitor pads 25 and 27. The fourth sharing pad 18 is arranged between the sixth and eighth coupling capacitor pads 26 and 28. In other embodiments, the first to eighth coupling capacitor pads 21-28, the first to fifth connector pads 10, 31-34 may be arranged on other locations of the PCB 100 according to need.

Figure 3:
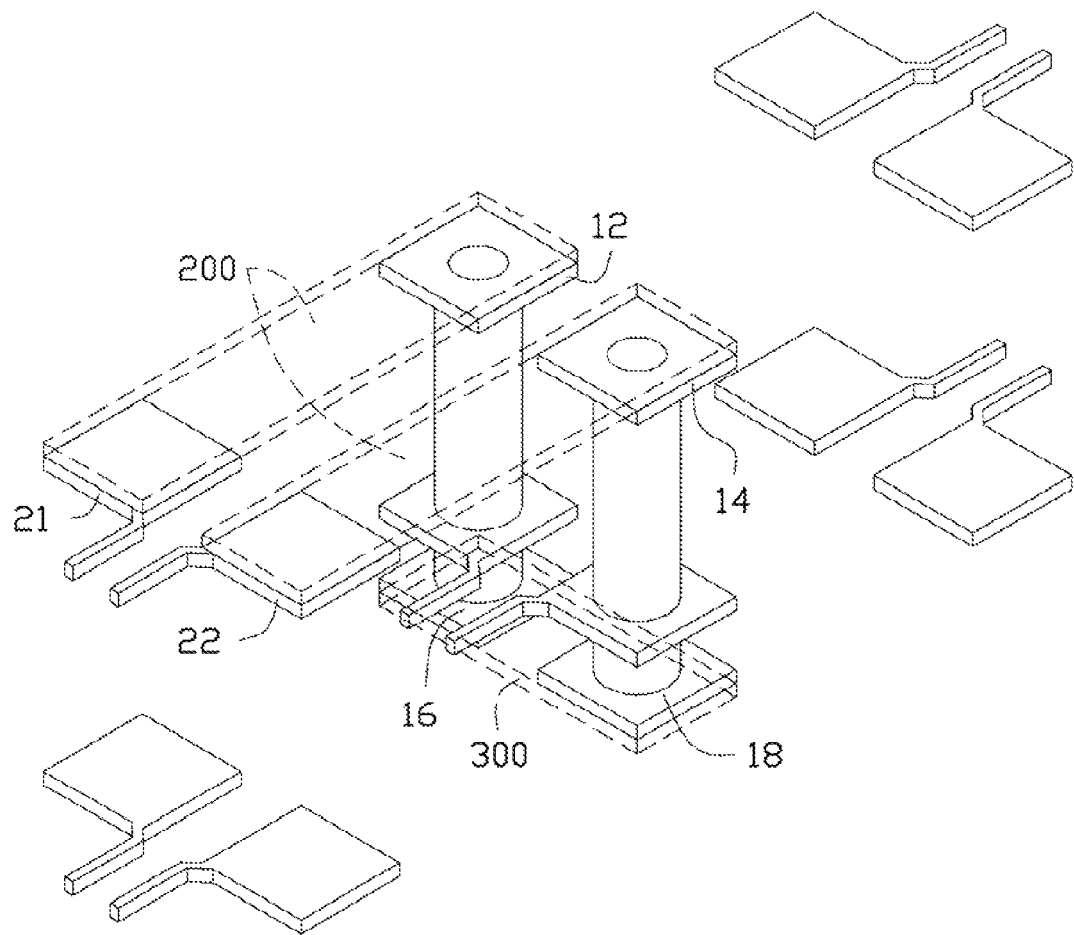
FIG. 3 is a schematic, isometric view of the PCB of FIG. 1, connected to a second connector.

Referring to FIGS. 2 and 3, when a connector (not shown) is installed on the second connector pad 31, the third to eighth coupling capacitor pads 23-28 are idle. Two coupling capacitors 200, such as alternating current (AC) coupling capacitors, are mounted to the PCB 100, one of which is connected to the first coupling capacitor pad 21 and the first sharing pad 12, and the other of which is connected to the second coupling capacitor pad 22 and the second sharing pad 14. A bridge capacitor 300 is connected to the third sharing pad 16 and the fourth sharing pad 18. Thus, the voltage signals output by the first connector pad 10, are transmitted to the connector installed on the second connector pad 31 through the transmission lines 110 and 120, the first and second vias 13 and 15, the first and second sharing pads 12 and 14, the coupling capacitors 200, the first and second coupling capacitor pads 21 and 22, and the transmission lines 210 and 220 in that order. The bridge capacitor 300 can decrease signal intensity of the voltage signals output by the first connector pad 10, to increase reliability of the voltage signals. In other embodiments, the bridge capacitor 300 can be omitted for saving costs.

Figure 4:
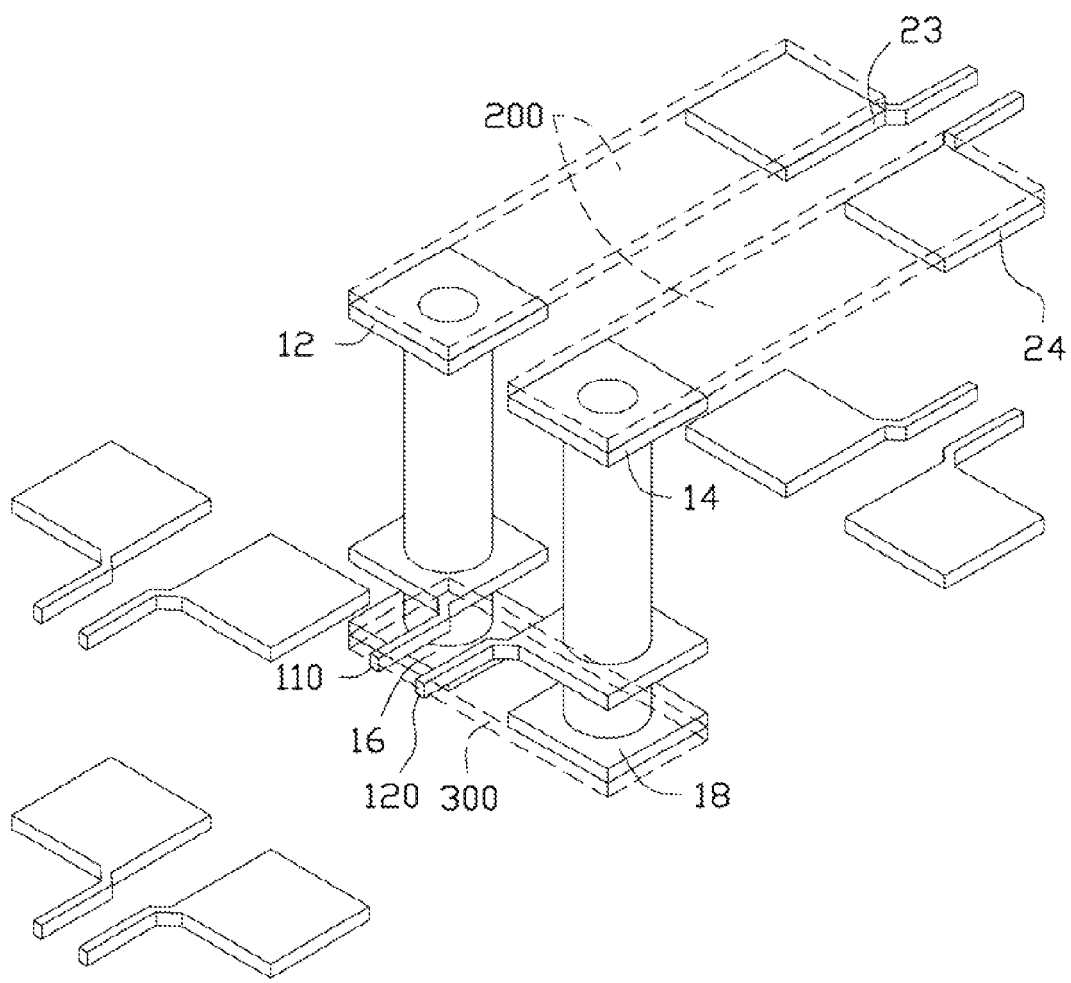
FIG. 4 is a schematic, isometric view of the PCB of FIG. 1, connected to a third connector.

Referring to FIG. 4, when a connector (not shown) is installed on the third connector pad 32, the first, second, and fifth to eighth coupling capacitor pads 21, 22, and 25-28 are idle. Two coupling capacitors 200 are mounted to the PCB 100, one of which is connected to the third coupling capacitor pad 23 and the first sharing pad 12, and the other of which is connected to the fourth coupling capacitor pad 24 and the second sharing pad 14. A bridge capacitor 300 is connected to the third sharing pad 16 and the fourth sharing pad 18. Thus, the voltage signals output by the first connector pad 10 are transmitted to the first voltage converting circuit 41 through the transmission lines 110 and 120, the first and second vias 13 and 15, the first and second sharing pads 12 and 14, the coupling capacitors 200, the third and fourth coupling capacitor pads 23 and 24, and the transmission lines 230 and 240 in that order. The voltage converting circuit 41 converts a received 3.3V to 5V and provides the converted 5V to the connector installed on the third connector pad 32.

Figure 5:
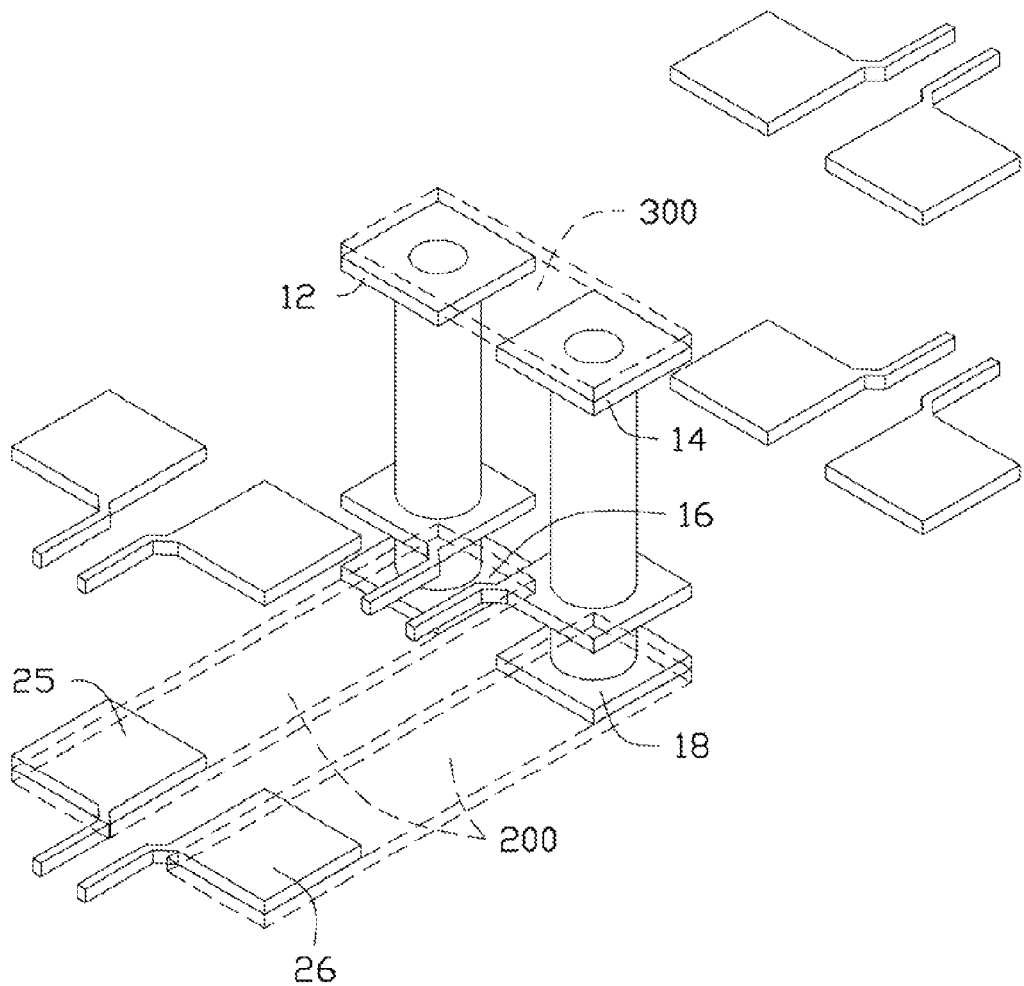
FIG. 5 is a schematic, isometric view of the PCB of FIG. 1, connected to a fourth connector.

Referring to FIG. 5, when a connector (not shown) is installed on the fourth connector pad 33, the first to fourth, seventh, and eighth coupling capacitor pads 21-24, 27, and 28 are idle. Two coupling capacitors 200 are mounted to the PCB 100, one of which is connected to the fifth coupling capacitor pad 25 and the third sharing pad 16, and the other of which is connected to the sixth coupling capacitor pad 26 and the fourth sharing pad 18. A bridge capacitor 300 is connected to the first sharing pad 12 and the second sharing pad 14. Thus, the voltage signals output by the first connector pad 10 are transmitted to the second voltage converting circuit 42 through the transmission lines 110 and 120, the first and second vias 13 and 15, the third and fourth sharing pads 16 and 18, the coupling capacitors 200, the fifth and sixth coupling capacitor pads 25 and 26, and the transmission lines 250 and 260 in that order. The second voltage converting circuit 42 converts a received 3.3V to 5V and provides the converted 5V to the connector installed on the fourth connector pad 33.

Figure 6:
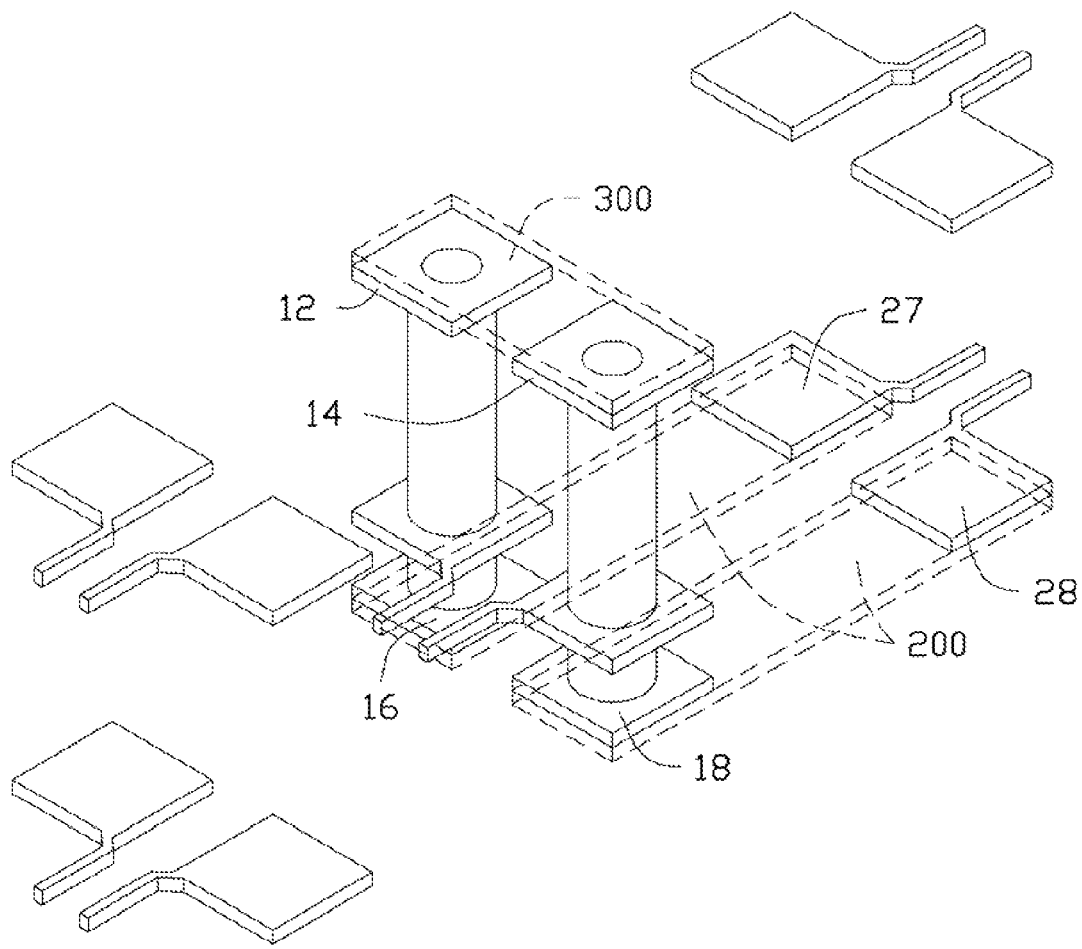
FIG. 6 is a schematic, isometric view of the PCB of FIG. 1, connected to a fifth connector.

Referring to FIG. 6, when a connector (not shown) is installed on the fifth connector pad 34, the first to sixth coupling capacitor pads 21-26 are idle. Two coupling capacitors 200 are mounted to the PCB 100, one of which is connected to the seventh coupling capacitor pad 27 and the third sharing pad 16, and the other of which is connected to the eighth coupling capacitor pad 28 and the fourth sharing pad 18. A bridge capacitor 300 is connected to the first sharing pad 12 and the second sharing pad 14. Thus, the voltage signals output by the first connector pad 10 are transmitted to the third voltage converting circuit 43 through the transmission lines 110 and 120, the first and second vias 13 and 15, the third and fourth sharing pads 16 and 18, the coupling capacitors 200, the seventh and eighth coupling capacitor pads 27 and 28, and the transmission lines 270 and 280 in that order. The third voltage converting circuit 43 converts a received 3.3V to 5V and provides the converted 5V to the connector installed on the fifth connector pad 34.

When the work voltage of one of the second to fifth connector pads 31-34 is different from the work voltage of the first connector pad 10, a voltage converting circuit is connected between one of the coupling capacitor pads and one connector pad, which has a work voltage different from the work voltage of the first connector pad 10. The voltage converting circuit converts the output voltage from the first connector pad 10 and provides the converted voltage to the corresponding connector, which is connected to the voltage converting circuit.

Thus, the PCB 100 is capable of flexibly supporting different types of connectors according to requirements, to decrease cost.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
   a first to a fourth coupling capacitors;
   a first to a fifth connector pads;
   a first to an eighth coupling capacitor pads;
   a first to a tenth transmission lines;
   a first via and a second via;
   a first to a fourth sharing pads; and
   at least one voltage converting circuit;
   wherein the first to third connector pads, the first to fourth transmission lines, and the first and second sharing pads are arranged in a first layer, the fourth and fifth connector pads, the fifth to eighth transmission lines, and the third and fourth sharing pads are arranged in a second layer below the first layer, the ninth and tenth transmission lines are arranged in a third layer between the first layer and the second layer, the first sharing pad is arranged between the first and third coupling capacitor pads, the second sharing pad is arranged between the second and fourth coupling capacitor pads, the third sharing pad is arranged between the fifth and seventh coupling capacitor pads, the fourth sharing pad is arranged between the sixth and eighth coupling capacitor pads;
   wherein the first sharing pad is electrically connected to the third sharing pad through the first via, the second sharing pad is electrically connected to the fourth sharing pad through the second via, the first connector pad is connected to the first and second vias through the ninth and tenth transmission lines;
   wherein first terminals of the first and second transmission lines are connected to the second connector pad, second terminals of the first and second transmission lines are connected to the first and second coupling capacitor pads, respectively, first terminals of the third and fourth transmission lines are connected to the third connector pad, second terminals of the third and fourth transmission lines are connected to the third and fourth coupling capacitor pads, respectively, first terminals of the fifth and sixth transmission lines are connected to the fourth connector pad, second terminals of the fifth and sixth transmission lines are connected to the fifth and sixth coupling capacitor pads, respectively, first terminals of the seventh and eighth transmission lines are connected to the fifth connector pad, second terminals of the seventh and eighth transmission lines are connected to the seventh and eighth coupling capacitor pads, respectively; and wherein the work voltage of at least one of the second to fifth connector pads is different from the work voltage of the first connector pad, a voltage converting circuit is connected between one coupling capacitor and a connector pad, which has the work voltage different from the work voltage of the first connector pad, the voltage converting circuit converts the output voltage from the first connector pad and provides the converted voltage to the corresponding connector, which is connected to the voltage converting circuit, the first sharing pad and the first coupling capacitor pad, or the second sharing pad and the second coupling capacitor pad are operable to connect the first coupling capacitor, the first sharing pad and the third coupling capacitor pad, or the second sharing pad and the fourth coupling capacitor pad are operable to connect the second coupling capacitor; wherein the third sharing pad and the fifth coupling capacitor pad, or the fourth sharing pad and the sixth coupling capacitor pad are operable to connect the third coupling capacitor, the third sharing pad and the seventh coupling capacitor pad, or the fourth sharing pad and the eighth coupling capacitor pad are operable to connect the fourth coupling capacitor.

2. The PCB of claim 1, wherein the first and second connector pads are mounted for peripheral component interconnection express (PCIE) connectors, the third to fifth connector pads are respectively mounted for a serial attached small computer system interface (SCSI) (SAS) connector, a serial advanced technology attachment (SATA) connector, and a universal serial bus (USB) connector, the at least one voltage converting circuit comprises a first voltage converting circuit connected between the third connector pad and the third and fourth coupling capacitor pads, a second voltage converting circuit connected between the fourth connector pad and the fifth and sixth coupling capacitor pads, and a third voltage converting circuit connected between the fifth connector pad and the seventh and eighth coupling capacitor pads.

3. The PCB of claim 2, wherein the first to third voltage converting circuits are boost circuits.

4. The PCB of claim 1, further comprising a bridge capacitor, wherein the bridge capacitor is operable to be connected to the third sharing pad and fourth sharing pad, in response to the first and second sharing pads being connected to the first and second coupling capacitors.

5. The PCB of claim 1, further comprising a bridge capacitor, wherein the bridge capacitor is operable to be connected to the first sharing pad and second sharing pad, in response to the third and fourth sharing pads being connected to the third and fourth coupling capacitors.

* * * * *